United States Patent
Di Palma et al.

(10) Patent No.: US 9,321,269 B1
(45) Date of Patent: Apr. 26, 2016

(54) METHOD FOR THE SURFACE TREATMENT OF A SEMICONDUCTOR SUBSTRATE

(71) Applicant: STMicroelectronics S.r.l., Agrate Brianza (IT)

(72) Inventors: Vincenza Di Palma, Cimitle (IT); Fabrizio Porro, Portici (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/836,131

(22) Filed: Aug. 26, 2015

(30) Foreign Application Priority Data

Dec. 22, 2014 (IT) ............................... TO2014A1089

(51) Int. Cl.
| | | |
|---|---|---|
| B41J 2/135 | (2006.01) | |
| B41J 2/16 | (2006.01) | |
| B41J 2/14 | (2006.01) | |

(52) U.S. Cl.
CPC ................ *B41J 2/164* (2013.01); *B41J 2/1433* (2013.01); *B41J 2/162* (2013.01)

(58) Field of Classification Search
CPC ............. B41J 2/16; B41J 2/1606; B41J 2/135
See application file for complete search history.

(56) References Cited

U.S. PATENT DOCUMENTS 7,156,488 B2 * 1/2007 Morris et al. ............ B41J 2/085
    347/45

FOREIGN PATENT DOCUMENTS

| EP | 0367438 A1 | 5/1990 |
|---|---|---|
| EP | 1057643 A2 | 12/2000 |
| WO | WO-2012173803 A1 | 12/2012 |

OTHER PUBLICATIONS

Konig, Martin, et al: "Micro-Contact Printing of OTFT on Polymer Foils," IEEE 2009 Electronic Components and Technology Conference, pp. 1322-1324.
Linford, Matthew R., et al: "Alkyl Monolayers on Silicon Prepared from 1-Alkenes and Hydrogen-Terminated Silicon," J. Am. Chem. Soc. 1995, 117, pp. 3145-3155.
IT Search Report and Written Opinion for IT TO2014A001089 mailed Sep. 14, 2015 (7 pages).

* cited by examiner

*Primary Examiner* — Juanita D Jackson
(74) *Attorney, Agent, or Firm* — Gardere Wynne Sewell LLP

(57) ABSTRACT

A method for application of an anti-wetting coating to a substrate of a semiconductor material is described. The method includes applying to a support a solution of a hydrocarbon comprising at least one unsaturated bond and, optionally, at least one hetero-atom for obtaining a layer of hydrocarbons. The method also includes treating at least one surface of the substrate of the semiconductor material with an acid. The layer of hydrocarbons is transferred from the support to the surface of the substrate of the semiconductor material. The layer of hydrocarbons is chemically coupled with the surface of the substrate of the semiconductor material. The method may be applied to an integrated ink jet printhead provided with a nozzle plate in which the nozzle plate serves as the substrate of the semiconductor material.

21 Claims, 3 Drawing Sheets

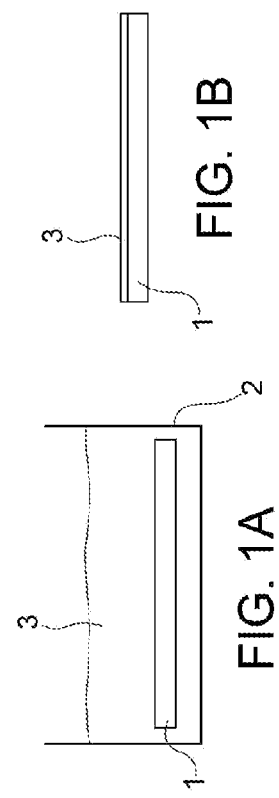
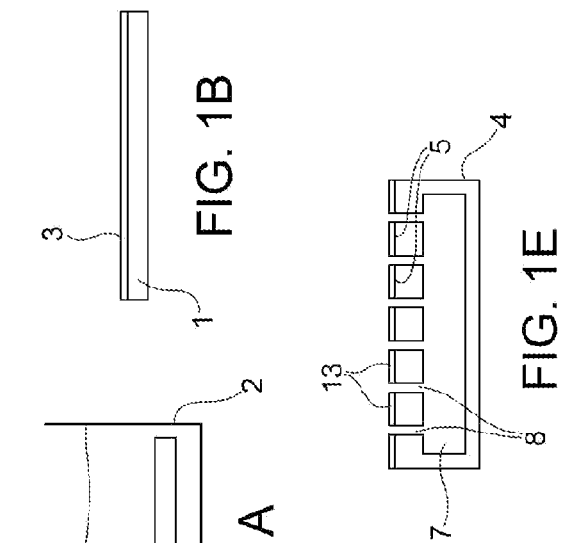
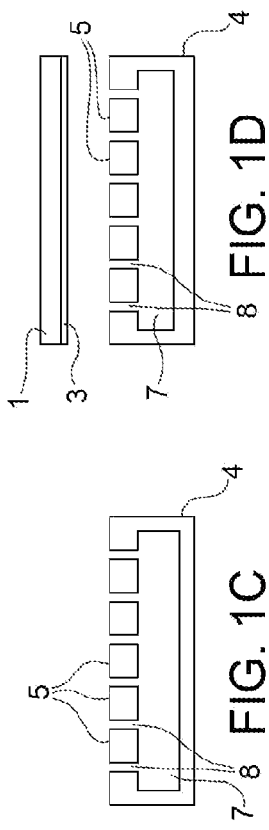
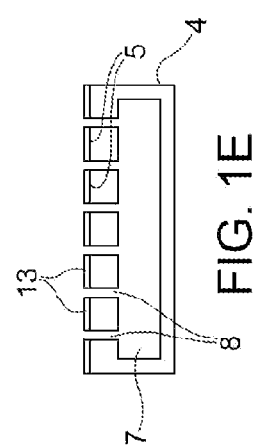
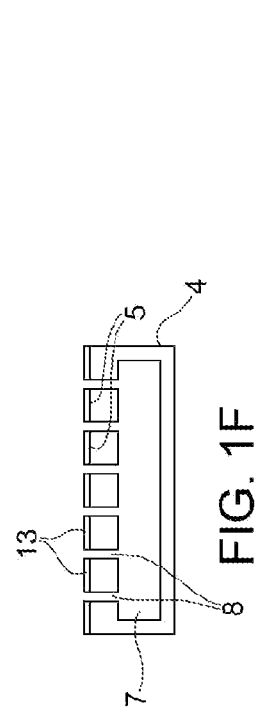
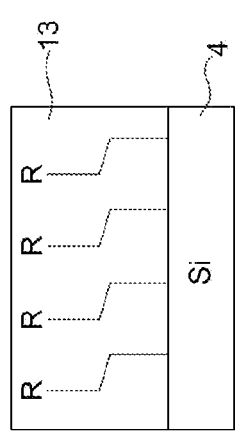
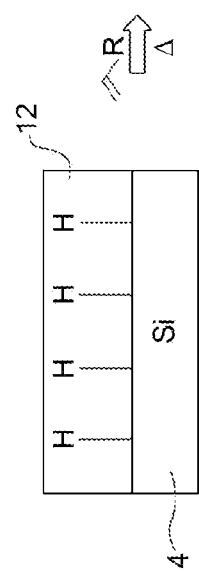

METHOD FOR THE SURFACE TREATMENT OF A SEMICONDUCTOR SUBSTRATE

PRIORITY CLAIM

This application claims the priority benefit of Italian Patent Application No. TO2014A001089, filed on Dec. 22, 2014, the contents of which are hereby incorporated by reference in their entirety to the maximum extent allowable by law.

TECHNICAL FIELD

The present invention relates to a method for surface treatment of a substrate of semiconductor material, in particular of a nozzle plate for ink jet printers and, more specifically, to a method for application of an anti-wetting coating that is chemically stable and confined on the surface of said nozzles.

BACKGROUND

In numerous applications, it is necessary to apply a water-repellent and/or oil-repellent coating on surfaces exposed to liquids. In the case of ink jet printheads, for example, it is necessary to apply an anti-wetting coating (AWC) on the printhead nozzle plate to prevent formation of residue of ink during and after ink-jet printing. In fact, the accumulation of residue around the orifice of the nozzle from which the drops of ink are expelled may cause an alteration of the direction of the drop, thus causing degradation of the quality of the printed images.

The anti-wetting treatment must further be applied only outside the orifice of the nozzles in order to prevent the printing resolution from being affected and must be chemically stable if it is put in contact with acidic or basic solutions, like many water-based inks, which would destroy the AWC in a short time.

Anti-wetting treatment of surfaces such as silicon, glass, or other inorganic or organic substrates may be obtained by depositing an anti-wetting polymeric layer by lamination, spin coating, or chemical vapor deposition (CVD).

The above treatments may offer good surface properties and excellent chemical stability, but are frequently unstable and may undergo delamination from the substrate when they are put in contact with the liquids. This phenomenon is due to the weak interaction of a physical type that binds together the deposited layer and the substrate. These physical interactions are in general due to hydrogen bonds or Van der Waals forces. Furthermore, the deposition techniques may cause application of the anti-wetting coating also within the orifice of the nozzle, thus causing alteration of the printing process.

Alternatively, an anti-wetting treatment may be obtained through a coating of a chemical type by creation of chemical bonds, which are stronger than physical bonds. Typically, this coating is obtained using molecules such as alkyl silanes or perfluoroalkyl silanes, chlorosilanes, or alkoxy silanes.

On the silicon surfaces, for example, alkyl silanes form a uniform monolayer (with a thickness ranging from a few angstrom to hundreds of nanometers) chemically bound to the silicon surface through an Si—O—Si bond.

The above coatings are not subject to delamination and enable the desired surface properties to be obtained through an appropriate choice of the alkyl tail. This type of coating is, however, known to be unstable when exposed to aqueous environments, as is the case of many water-based inks In particular, the Si—O—Si anchoring bonds are unstable in aqueous environments, above all, if the pH is not neutral.

SUMMARY

One aim as described herein is to provide a method for application of an anti-wetting coating that will be free from the known disadvantages, in particular, and will not undergo physical and/or chemical degradation over time, including when it is put in contact with acid or basic aqueous solutions, and will enable application of the described anti-wetting coating to confined areas, such as the nozzle plate for an ink-jet printer.

A method described herein includes a method for application of an anti-wetting coating to a substrate of a semiconductor material. An integrated ink jet printhead is also described. The integrated ink jet printhead may comprise a body of semiconductor material housing an ink chamber, an inlet channel, an outlet channel, and a nozzle plate which extends over the body, in which the nozzle plate is constituted by a support of the semiconductor material covered with an anti-wetting coating provided as described herein.

In an embodiment, a method for application of an anti-wetting coating to a substrate of a semiconductor material comprises the steps of: applying to a support a solution of a hydrocarbon comprising at least one unsaturated bond and, optionally, at least one hetero-atom, for obtaining a layer of hydrocarbons on the support; treating at least one surface of the substrate of the semiconductor material with an acid; transferring said layer of hydrocarbons from said support to said at least one surface of said substrate of the semiconductor material; and chemically coupling said layer of hydrocarbons to said at least one surface of said substrate of the semiconductor material, the layer of hydrocarbons when chemically coupled forming the anti-wetting coating.

In an embodiment, an integrated ink jet printhead comprises: a body housing an ink chamber; an inlet channel; an outlet channel; and a nozzle plate extending over at least a portion of the body, the nozzle plate having a surface comprising a semiconductor material covered with an anti-wetting coating, the anti-wetting coating provided as a monolayer of hydrocarbons having an inclined and orderly orientation, the monolayer of hydrocarbons comprising unsaturated hydrocarbons having a backbone selected from one or more of alkenes and alkynes with from eight to twenty carbon atoms, the monolayer of hydrocarbons bonded to the semiconductor material, bonds being fixed chemically to the semiconductor material, provided as stable Si—C bonds, the anti-wetting coating confined to the nozzle plate without interfering with the outlet channel or electrical connections integrated to the body.

BRIEF DESCRIPTION OF THE DRAWINGS

The foregoing will now be described in detail with reference to the figures in the accompanying drawings, wherein:

FIGS. 1A-1F are schematic illustrations of one embodiment of the described method;

FIGS. 2A-2C illustrate the chemical reaction that occurs between the substrate of semiconductor material and the unsaturated hydrocarbons;

DETAILED DESCRIPTION

Figure 3A:
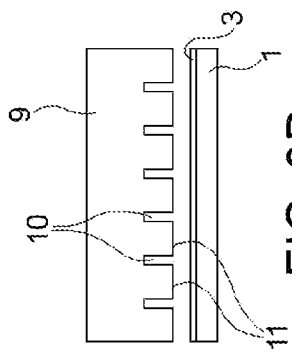
FIGS. 3A-3H are schematic illustrations of another embodiment of the described method.

The ensuing description includes a method for application of an anti-wetting coating to a substrate of semiconductor material comprising the steps of: applying to a support a solution of a hydrocarbon comprising at least one unsaturated bond and, optionally, at least one hetero-atom, for obtaining an unsaturated layer of hydrocarbons; treating at least one surface of a substrate of semiconductor material with an acid; transferring the unsaturated layer of hydrocarbons from the support to the surface of the substrate of semiconductor material; and chemically coupling the unsaturated layer of hydrocarbons to the surface of the substrate of semiconductor material.

The present method is based on the process referred to as "hydrosilation", which consists of causing molecules of an unsaturated hydrocarbon (for example, a 1-alkene or a 1-alkyne) to react with a silicon surface, exposing hydrogen atoms. In particular, with the method described it is possible to create a monolayer of hydrocarbons, the monolayer characterized by a strong Si—C bond between carbon atoms in the monolayer and silicon atoms on the surface of a semiconductor substrate. The monolayer thus obtained is densely packed, with hydrocarbon chains in orientations that are inclined and orderly with respect to the surface of the substrate. The monolayer prevents oxidation of the substrate and is stable to acid and basic solvents. The monolayer is an anti-wetting monolayer.

The present method further enables application in a confined way of the anti-wetting monolayer having appropriate chemical stability. For example, in the case of application to an ink jet printhead, unlike the methods known in the art, the present method enables confinement of the application of the anti-wetting layer only at the orifices of the nozzles without involving the openings through which the ink is expelled. It is further possible to apply the anti-wetting monolayer as a coating only on specific portions of the semiconductor substrate, leaving intact other portions that are designed for positioning of electrical contacts.

Finally, the present method enables a simple adaptability to mass production using roll-to-roll techniques.

For example, the substrate of semiconductor material is a silicon substrate and may present openings arranged according to a pattern. In particular, the substrate of semiconductor material may be a nozzle plate for ink jet printing, as described with reference to FIG. 4.

The hydrocarbon comprising at least one unsaturated bond is chosen from the group comprising alkenes and alkynes and mixtures thereof. In particular, the hydrocarbon may contain from eight to twenty carbon atoms. For example, the unsaturated hydrocarbon may be chosen from the group constituted by 1-alkenes, 1-alkynes, and various mixtures thereof. In some embodiments, each hydrocarbon in the alkene solution, or in the alkyne solution or in the solution mixture containing the alkenes and the alkynes are the same length (same number of carbon atoms). Hydrocarbons in the alkene solution, or in the alkyne solution, or in the solution mixture (comprising alkenes and alkynes) may also differ in chain length. The hydrocarbon may be provided as a monomer, dimer, trimer, or as a polymer. The hydrocarbon as a monomer, dimer, trimer, or polymer is often provided as an alkene or an alkyne containing from eight to twenty carbon atoms in which the alkene or alkyne has the same carbon chain length.

The hydrocarbon may further be functionalized to bestow desired chemical properties on the surface where it is applied. Functional groups chosen to impart said surface property may be selected from known functional groups, including but not limited to hydrophobic functional groups (terminations providing a hydrophobic interaction, or functional groups having a terminating hydrogen). Representative examples include alkyl groups, perfluoro alkyl groups. There is no apparent size limitation for the functional group.

The step of chemical coupling may be conducted by heating or UV irradiation.

In the case where the step of chemical coupling is carried out by heating, the temperature is between 100° C. and 200° C., in particular between 150° C. and 200° C. For example, heating may be carried out in a time interval comprised between 1 and 2 hours.

Alternatively, the step of chemical coupling may be carried out using UV irradiation at a wavelength ranging from 254 to 300 nm, with irradiation times ranging from 200 to 15000 seconds.

The present method will now be described with reference to FIGS. 1A-1F, which show steps according to an embodiment of the described method.

In FIG. 1A, a support 1, such as a flexible planar support, is immersed in a container 2 comprising a solution of an unsaturated hydrocarbon 3, for example a 1-alkene solution for a time ranging from 10 minutes to 6 hours. The support 1 may be, for example, polydimethylsiloxane (PDMS), polytetrafluoro ethylene (PTFE), or fluorinated polymers (which are particularly suitable when a mould transparent to UV is necessary), such as those based upon polyfluoropolyether (PFPE), ethylene tetrafluoroethylene (ETFE) and PTFE (e.g., Teflon®, registered with The Chemours Company FC, Delaware, USA), or acrylated polyurethanes. In general, the support 1 must be of a material that enables flexibility thereof so that it will be able to adapt to any roughness present on the surfaces with which it will be put in contact during execution of the present method. For example, the material of which the support 1 is made is a polymeric material and has a Young's modulus comprised between 100 kPa and 5 GPa. Furthermore, said material must guarantee a sufficient adsorption of the solution of the hydrocarbon 3, remaining unaltered in its structure and in its mechanical, physical, and chemical characteristics. It may finally be reused for a number of prints.

The support 1 thus obtained (FIG. 1B) has a layer of hydrocarbon 3 that must be transferred onto a substrate 4 (FIG. 1C). The substrate 4 (FIG. 1C) is a semiconductor material, for example, silicon, having a surface 5 previously treated with an acid, for example hydrofluoric acid (HF), ammonium fluoride, or a mixture thereof.

In FIG. 1C, the substrate 4 is a body provided with a chamber 7 for housing a liquid and openings 8, which are arranged according to a first pattern and which extend between the surface 5 and the chamber 7 for enabling exit of the liquid from the chamber 7.

The support 1 is then put in contact with the first surface 5 of the substrate 4, as shown in FIG. 1D, for partially transferring the layer of hydrocarbon 3 onto the surface 5 of the substrate 4. The transfer step may have a duration comprised between 2 seconds and 1 minute.

In this way, transfer of the layer of hydrocarbon 3 occurs in a way confined exclusively to points of contact between the support 1 and the surface 5 of the substrate 4, without involving the openings 8 or the chamber 7. The structure of FIG. 1E is thus obtained, where present on the surface 5 of the substrate 4 is an anti-wetting layer 13 formed by the material of the layer of hydrocarbon 3.

Next, as illustrated in FIG. 1F, the anti-wetting layer 13 is fixed, i.e., chemically associated, to the surface 5 of the substrate 4, for example, by heating at 200° C. for 2 hours.

The chemical reaction that takes place between the substrate 4 and the anti-wetting layer 13 is given in FIGS. 2A-2C.

As illustrated in FIGS. 2A-2C, initially, the substrate 4 has a passivation layer 6 (for example, $SiO_2$) on the surface 5. The treatment, for instance with hydrofluoric acid, as described above with reference to FIG. 1C, has the purpose of removing the passivation layer 6 and forming a silicon layer 12 that exposes hydrogen atoms (see FIG. 2B). The layer of hydrocarbon 3 is then transferred onto the layer 12. Subsequent heating causes the hydrocarbon 3 to be firmly fixed to the substrate 4 by stable Si—C chemical bonds, thus forming the anti-wetting layer 13.

Figure 3B:
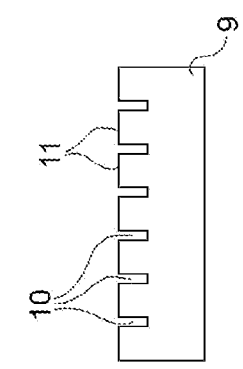
Figure 3C:
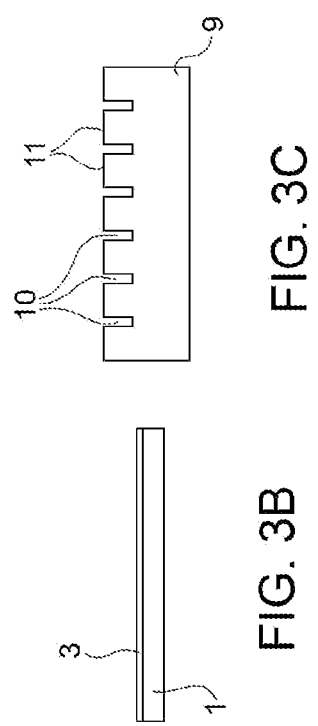

In another embodiment, illustrated in FIGS. 3A-3H, for transferring the layer of hydrocarbon 3 from the support 1 to the surface 5 of the substrate 4, a mold 9 is used (FIG. 3C). The mold 9, which is, for example, of PDMS or PTFE, has a surface 11 that presents cavities 10 arranged according to a second pattern identical to that of the openings 8 on the surface 5 of the substrate 4. The cavities 10 are further congruent to the openings 8 present on the surface 5 of the substrate 4.

Figure 3D:
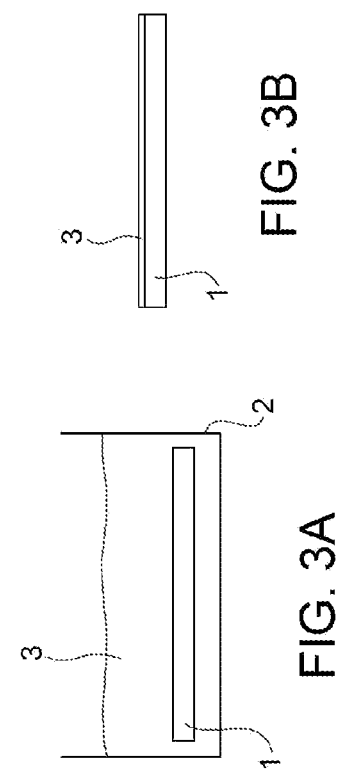
Figure 3E:
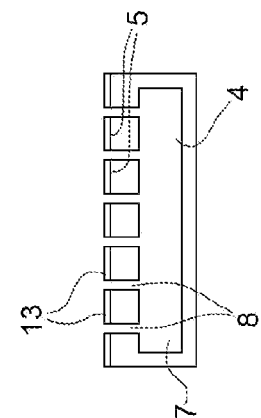

Here, initially, as illustrated in FIGS. 3A-3B, the layer of hydrocarbon 3 is deposited on the support 1, as has been described with reference to FIGS. 1A-1B. Then, as illustrated in FIG. 3D, the surface 11 of the mold 9 is put in contact with the layer of hydrocarbon 3 on the support 1, for example for a time ranging from 2 seconds to 1 minute, for transferring part of the layer of hydrocarbon 3 onto the surface 11 of the flexible mold 9, to form a transfer layer 23, of the same material as the layer of hydrocarbon 3 (FIG. 3E).

Figure 3F:
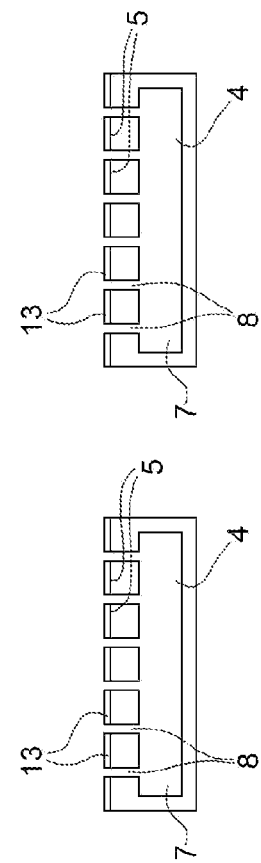
Figure 3G:
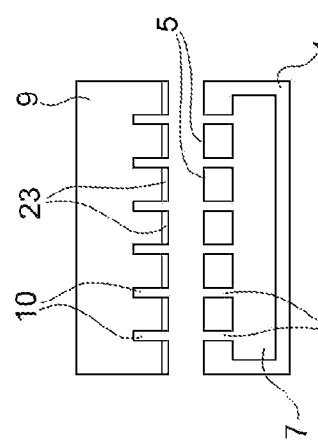
Figure 3H:
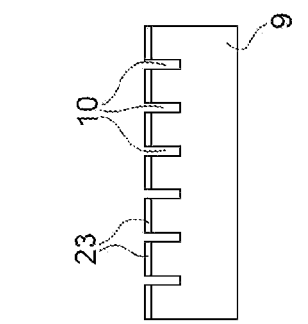

The transfer layer 23 present on the surface 11 of the mold 9 is then put in contact with the surface 5 of the substrate 4, for example for a time ranging from 2 seconds to 1 minute, in such a way that the openings 8 are aligned with the cavities 10 (FIG. 3F).

In this way, the transfer layer 23 is transferred onto the surface 5 of the substrate 4 precisely and in a confined way, without any risk of part of the molecules of hydrocarbon 3 penetrating into the openings 8 or into the chamber 7.

The mold 9 may further be used also for transferring the layer of hydrocarbon 3 onto a support 4 without the openings 8. Alternatively, a mold 9 without the cavities 10 may be used for transferring the layer of hydrocarbon 3 both onto a support 4 without openings 8 and onto a support that presents such openings.

Likewise, with reference to the embodiment illustrated in FIGS. 1A-1F, the support 1 may be provided with cavities similar to the cavities 10 of the mold 9 for application of the hydrocarbon 3 in discrete areas of the substrate 4, which may also be without the openings 8.

Figure 4:
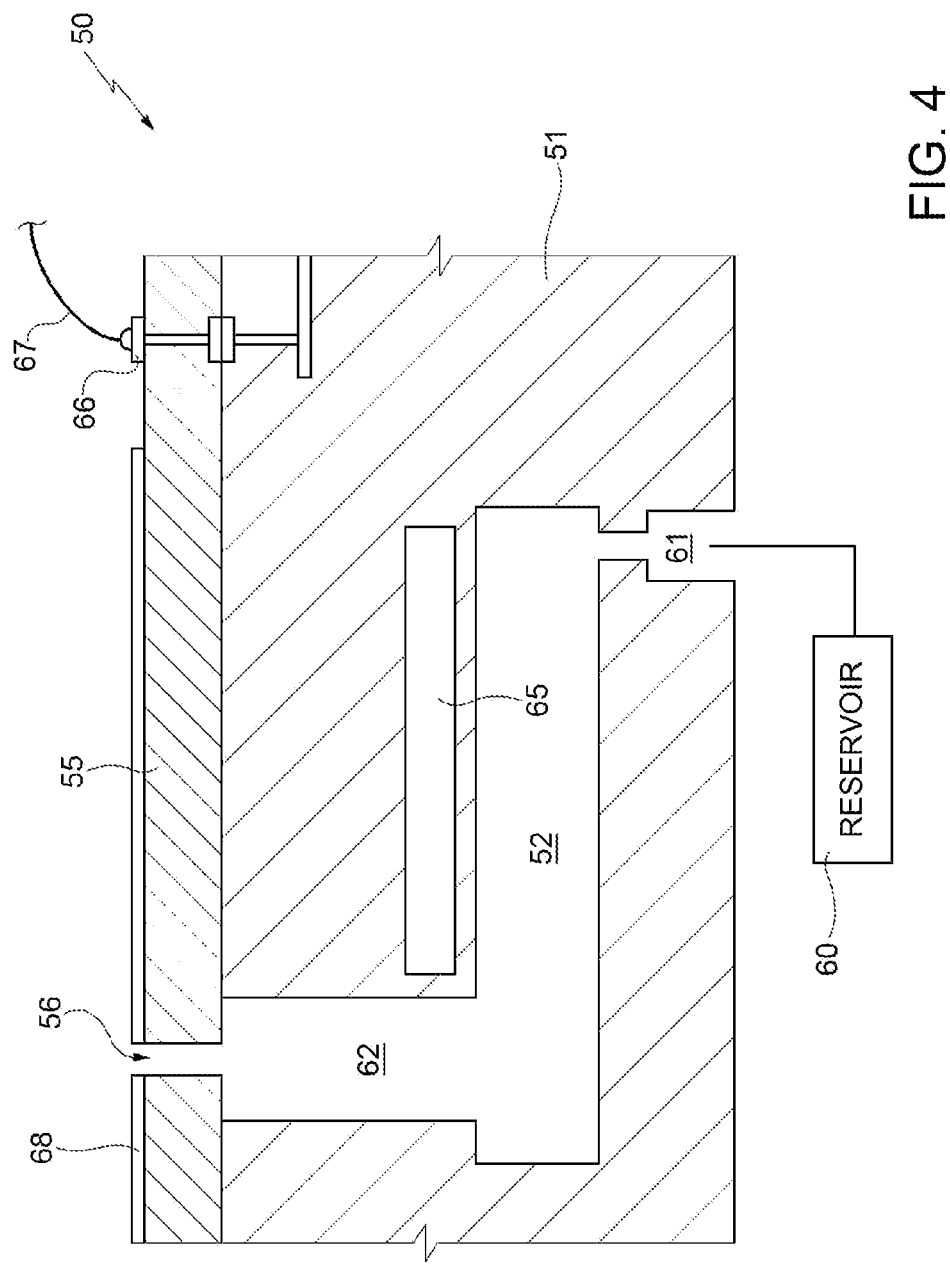
FIG. 4 shows a cross-section through an ink jet printhead to which the described method may be applied.

An example of application of the present method is creation of a chemically stable anti-wetting layer confined on the nozzle plate of an ink jet printhead, shown schematically in FIG. 4. Here the printhead, designated as a whole by 50, comprises a body 51, for example of silicon or glass, housing a chamber 52 similar to the chamber 7 of FIGS. 1C and 3F. A nozzle plate 55 extends over the body 51 and has at least one nozzle 56, similar to the openings 8 of FIGS. 1C and 3F. Alternatively, the nozzle plate 55 may comprise a plurality of nozzles 56 (not shown), each connected to a different chamber 52. The chamber 52 is connected to an external reservoir 60 through an inlet channel 61 and with the nozzle 56 through an outlet channel 62. A membrane 65 extends on one side of the chamber 52 in order to push the liquid contained in the chamber 52 towards the nozzle 56. Valves (not shown) enable the desired movement of the liquid, here an ink.

The top surface of the nozzle plate 55 has an anti-wetting layer 68, obtained with the "contact printing" method described with reference to FIG. 1A-1F or 3A-3H.

The anti-wetting layer 68 is deposited in a confined way, as described previously, in such a way also to prevent covering of the contacts (of which FIG. 4 shows just one, designated by 66) for electrical connection between electronic components (not shown) integrated within the body 61 with the outside world, via wire 67, as well as covering of all those parts in which the anti-wetting coating is not required.

The above method may further be used for deposition of an anti-wetting layer on an ink-jet printhead of any type commercially available.

Further characteristics of the present method will emerge from the ensuing description of some examples provided merely by way of non-limiting illustration.

Example 1

Preparation of an Anti-Wetting Coating on a Substrate of Semiconductor Material

The first step of the process consists of fabrication of a PDMS support.

In detail, a prepolymeric mixture is prepared, constituted by a base SYLGARD® 184 SILICONE ELASTOMER KIT (registered with Dow Corning Corporation, Michigan, USA) and a cross-linking agent (Dow Corning) in the weight ratio 10:1. Degassing of the mixture in vacuum conditions is then carried out for one hour. The mixture thus obtained is deposited on a silicon master measuring 3 cm by 3 cm. The master is previously coated with a layer of organosilanes for enabling subsequent detachment of the PDMS support. The mixture deposited on the master is then cross-linked at 90° C. in an oven for one hour, and the PDMS support thus obtained is detached from the silicon master.

The PDMS support thus obtained is immersed in a solution of 1-hexadecene chain for 12 hours under nitrogen flow.

The PDMS support is then removed from the solution of 1-hexadecene and exposed to nitrogen flow for 30 seconds in order to eliminate the excess liquid.

It is then put in contact with a silicon substrate for 30 seconds in nitrogen atmosphere in order to transfer a layer of alkene exclusively to the contact areas of the silicone substrate.

The silicon substrate is previously prepared by immersing it in a 2% HF aqueous solution for 2 minutes, followed by rinsing in distilled water for 30 seconds, in order to create hydrogen terminations on the surface itself.

After contact between the PDMS support and the silicon substrate, a heating at 200° C. in nitrogen is carried out for 2 hours, during which formation of the Si—C bonds occurs according to the hydrosilation reaction.

The PDMS support is then separated from the silicon substrate, which is then washed in an appropriate organic solvent, such as mesitylene and the like, to remove alkene that had not reacted.

Example 2

Performance of the Anti-Wetting Substrate According to Example 1

A nozzle plate for ink jet printing provided according to the methodology illustrated in Example 1 is tested as to its anti-wetting capacity.

Four identical plates (specimens 1-4) of dimensions 40 mm×12 mm are each introduced into a vial containing a water-based ink and cyan pigment having a pH comprised between 7 and 9.

Each plate is immersed for two thirds of their surface in the ink. The vials are then closed to prevent evaporation of the ink and set at the temperature of 60° C. for 7 days.

Next, the plates are removed from the vials and cleaned with demineralized water and then with 2-propanol. The plates are then dried.

The anti-wetting capacity of the plates thus obtained is evaluated by measuring the angle of contact of a drop of water deposited thereon. In particular, comparisons are made between the values of the angle of contact on the plate prior to application of the anti-wetting layer according to the method described (angle of contact prior to hydrosilation), of the angle of contact on the plate after application of the anti-wetting layer according to the method described (angle of contact after hydrosilation), and of the angle of contact on the plate after immersion in the ink. The results obtained appear in Table 1.

TABLE 1

| Sample | Angle of contact prior to hydrosilation | Angle of contact after hydrosilation | Angle of contact after immersion in the ink |
|---|---|---|---|
| 1 | 18.0 ± 1.3 | 107.3 ± 0.6 | 94.4 ± 2.0 |
| 2 | 16.2 ± 1.0 | 99.6 ± 1.0 | 95.9 ± 1.8 |
| 3 | 20.2 ± 0.6 | 104.4 ± 1.2 | 98.2 ± 2.0 |
| 4 | 19.3 ± 1.2 | 100.9 ± 0.5 | 92.5 ± 3.5 |

As may be noted, notwithstanding immersion in a particularly aggressive ink, the values of the angle of contact remain very high (90% of the values after hydrosilation), indicating good chemical resistance of the coating obtained by the method described herein.

Comparison with the Silane-Based Coatings of the Known Art:

A plate from Example 2 (Sample 1) is compared with plates that had a coating obtained by silanization according to the prior art.

In particular, the following samples having prior art silanic coatings are provided:

Sample 5: plate coated with FOTS (trichloro(1H,1H,2H, 2H-perfluoro octyl)silane);

Sample 6: plate coated with silane Fluorolink® S10 (registered with Solvay Solexis, Inc., New Jersey, USA);

Sample 7: plate coated with PTMS (propyl trimethoxysilane).

Also in this case, the anti-wetting capacity is evaluated by measuring the angle of contact of a drop of water deposited on the specimens. The results appear in Table 2.

TABLE 2

| | Sample 1 | Sample 5 | Sample 6 | Sample 7 |
|---|---|---|---|---|
| Prior to immersion in ink | 107.3 ± 0.6 | 108.7 ± 4.0 | 127.3 ± 2.6 | 103.0 ± 1.0 |
| After immersion in ink | 94.4 ± 2.0 | <10 | 12 | 10.0 |

Also in this case, it should be noted that the anti-wetting layers obtained with the method described herein, albeit presenting an initial angle of contact comparable with that of the coatings according to the prior art, are more stable after contact with the ink.

Comparison with the coatings applied by the immersion method according to the known art:

Four samples obtained according to what is illustrated in Example 1 are compared with two plates having a 1-hexadecene coating applied by immersion of the plates in the alkene and subsequent heating (Samples 8 and 9). In particular, said Samples 8 and 9 are prepared as described below.

In a round-bottom flask with a capacity of approximately 100 mL, 3 mL of pure 1-hexadecene are set to degas for approximately 1 hour in nitrogen. A silicon substrate (3 cm×1 cm) is previously immersed in a 2% (v/v) (40%) HF aqueous solution for 2 minutes and then rinsed in distilled water for 30 seconds in order to obtain a surface with hydrogen terminations.

The silicone substrate is immersed into the flask with the 1-hexadecene solution.

The flask is immersed in an oil bath and kept at the temperature of 200° C. for 2 hours, once again under nitrogen flow. Next, the silicone substrate is taken out of the solution, washed and sonicated three times in mesitylene, and finally washed with distilled water and then dried with nitrogen.

The anti-wetting capacity is evaluated by measuring the angle of contact of a drop of water deposited on the substrate samples. The results appear in Table 3.

TABLE 3

| Sample | Angle of contact |
|---|---|
| Sample 1 | 102.1 ± 3.4 |
| Sample 2 | 107.1 ± 2.2 |
| Sample 3 | 104.8 ± 1.2 |
| Sample 4 | 109.9 ± 0.4 |
| Sample 8 | 104.6 ± 3.8 |
| Sample 9 | 105.3 ± 2.1 |

As may be noted, the angles of contact between the samples obtained with the present method and those where the coating was applied by immersion are comparable. However, the method described enables application of the coating in an extremely confined way unlike the immersion method.

The invention claimed is:

1. A method for application of an anti-wetting coating to a substrate of a semiconductor material, comprising the steps of:
    applying to a support a solution of a hydrocarbon comprising at least one unsaturated bond and, optionally, at least one hetero-atom, for obtaining a layer of hydrocarbons on the support;
    treating at least one surface of the substrate of the semiconductor material with an acid;
    transferring said layer of hydrocarbons from said support to said at least one surface of said substrate of the semiconductor material; and
    chemically coupling said layer of hydrocarbons to said at least one surface of said substrate of the semiconductor material to form the anti-wetting coating.

2. The method according to claim 1, wherein said hydrocarbon is selected from the group consisting of alkenes and alkynes.

3. The method according to claim 1, wherein said hydrocarbon contains from 8 to 20 carbon atoms.

4. The method according to claim 1, wherein said hydrocarbon is selected from the group consisting of 1-alkenes, 1-alkynes, and combinations thereof.

5. The method according to claim 1, wherein said applying to the support the solution of the hydrocarbon comprises immersing said support in said solution of the hydrocarbon.

6. The method according to claim 1, wherein said support is a material having a Young's modulus comprised between 100 kPa to 5 GPa.

7. The method according to claim 1, wherein said acid is selected from the group consisting of hydrofluoric acid, ammonium fluoride, and a mixture thereof.

8. The method according to claim 1, wherein the transferring said layer of hydrocarbons includes placing said support in contact with said at least one surface of said substrate of the semiconductor material.

9. The method according to claim 1, wherein said support is a mold and the transferring said layer of hydrocarbons is performed by using the mold.

10. The method according to claim 1, wherein said substrate of the semiconductor material is a silicon substrate.

11. The method according to claim 1, wherein said substrate of the semiconductor material has first openings arranged in a first pattern.

12. The method according to claim 11, wherein said substrate of the semiconductor material is a nozzle plate for ink-jet printing.

13. The method according to claim 1, wherein said substrate of the semiconductor material has first openings arranged in a first pattern, the support being a mold having cavities arranged in a second pattern identical to said first pattern, and said transferring said layer of hydrocarbons is carried out by aligning said openings with said cavities.

14. The method according to claim 1, wherein said chemically coupling said layer of hydrocarbons to said at least one surface is carried out by heating to a temperature comprised between 100 and 200° C.

15. The method according to claim 1, wherein said chemically coupling said layer of hydrocarbons to said at least one surface is carried out by UV irradiation.

16. The method according to claim 1, wherein the chemically coupling said layer of hydrocarbons to said at least one surface is carried out by heating to a temperature comprised between 100 and 200° C. for 1 hour to 2 hours.

17. The method according to claim 1, wherein the hydrocarbon is functionalized.

18. The method according to claim 1, wherein said chemically coupling said layer of hydrocarbons to said at least one surface is carried out by UV irradiation at a wavelength ranging from 254 nm to 300 nm and an irradiation time ranging from 200 seconds to 15000 seconds.

19. The method according to claim 1, wherein the method further comprises washing the anti-wetting coating with an organic solvent.

20. The method according to claim 1, wherein the method further comprises washing the anti-wetting coating to remove unreacted hydrocarbons.

21. An integrated ink-jet printhead, comprising:
a body housing an ink chamber;
an inlet channel;
an outlet channel; and
a nozzle plate extending over at least a portion of the body, the nozzle plate having a surface comprising a semiconductor material covered with an anti-wetting coating,
the anti-wetting coating provided as a monolayer of hydrocarbons having an inclined and orderly orientation, the monolayer of hydrocarbons comprising unsaturated hydrocarbons having a backbone selected from one or more of alkenes and alkynes with from eight to twenty carbon atoms, the monolayer of hydrocarbons bonded to the semiconductor material, bonds being fixed chemically to the semiconductor material, provided as stable Si—C bonds, the anti-wetting coating confined to the nozzle plate without interfering with the outlet channel or electrical connections integrated to the body.

* * * * *